United States Patent [19]

Carlstedt

[11] Patent Number: 5,325,501
[45] Date of Patent: Jun. 28, 1994

[54] ASSOCIATIVE MEMORY

[75] Inventor: L. Gunnar Carlstedt, Partille, Sweden

[73] Assignee: Carlstedt Elektronik AB, Gothenburg, Sweden

[21] Appl. No.: 739,541

[22] Filed: Aug. 2, 1991

[30] Foreign Application Priority Data

Aug. 2, 1990 [SE] Sweden .............................. 9002558

[51] Int. Cl.$^5$ .............................................. G06F 13/14
[52] U.S. Cl. ........................... 395/425; 364/DIG. 1; 364/251.5; 364/253; 365/49
[58] Field of Search ... 364/200 MS File, 900 MS File; 395/400, 425; 365/49

[56] References Cited

U.S. PATENT DOCUMENTS

| 3,634,833 | 1/1972 | Dunn et al. ............... 340/173 FF |
| 4,488,260 | 12/1984 | Cantarel .......................... 365/49 |
| 4,777,622 | 10/1988 | Palm et al. ....................... 365/49 |
| 4,879,687 | 11/1989 | Okamoto et al. ................. 365/49 |
| 4,890,260 | 12/1989 | Chuang et al. ................... 365/49 |
| 4,928,260 | 5/1990 | Chuang et al. ................... 365/49 |
| 4,965,767 | 10/1990 | Kinoshita et al. ................ 365/49 |
| 4,975,873 | 12/1990 | Nakabayashi et al. ............ 365/49 |
| 5,014,195 | 5/1991 | Farrell et al. .................... 365/49 |
| 5,034,918 | 7/1991 | Jeong ............................... 365/49 |

FOREIGN PATENT DOCUMENTS

| 0227348 | 7/1987 | European Pat. Off. . |
| 2091964 | 1/1972 | France . |
| 62-134890 | 6/1987 | Japan . |

OTHER PUBLICATIONS

"Content-Addressable Memory Does Fast Matching", *Electronic Design*, Dec. 8, 1988, By Dave Bursky, pp. 119–121.

*Primary Examiner*—Joseph L. Dixon
*Assistant Examiner*—Hiep T. Nguyen
*Attorney, Agent, or Firm*—Young & Thompson

[57] ABSTRACT

An associative memory is provided having a first control bus arrangement (any type, Vr, cpb, set.s, match, r/w.s, r/w.b, r/w.r, Wand.a, Wand.b, Wor, s.a, reset.b, mode.a mode.a*, prech, ba, mode.b, grant.b, prio etc) for external control and a second memory bus arrangement (t1, t2, id, anv, v0, v1, v2, v3) for data. The memory includes several storage cells (1) for storing a composed information. Each storage cell stores at least one mark, which indicates at least select state(s) or non select state(s) for said storage cell. The mark(s) are set by search operations among said cells. A priority decoder (2) is provided to which all said storage cells are coupled and which selects one out of several of said storage cells. At least one global bus (4, 5) is provided for making logical operations of the type AND and OR between said storage cells. A closure head (11) is provided in each storage cell for communicating with said buses and to control said storage cell to take part in an actual logical operation. Each storage cell includes a number of data object storage fields (IDENTITY, ENVIRONMENT, VALUE/DES.$_0$, VALUE/DES.$_1$, VALUE/DES.$_2$, VALUE/DES.$_3$), which are able to store a data word and at least one of said marks, being in form of tags.

23 Claims, 6 Drawing Sheets

ASSOCIATIVE MEMORY

This invention relates to an associative memory, i.e. a memory in which its information containing cells are addressed in dependence of content in at least a part of the cell and not in dependence of its position in the memory. Thus, there are no physical address or dependence on the physical position.

BACKGROUND OF THE INVENTION

A conventional associative memory has storage cells divided into an associative area and a storage area. The writing of information into an associative memory is made without address. The cell area is commonly arranged as shift registers.

The computer was invented during the 1940:s. Since then it has been developed with a revolutionary speed. In spite of this it is hard to understand that current days computers have almost the same architecture as the first ones.

Most improvements have been in the hardware. The introduction of VLSI and the enhancement in lithography has made it possible to build computers on chips that five years ago were super computers. The dimensions have shrunk exponentially and the line width is now less than 1 micrometer. The clock rate as well as the number of active transistors have increased many orders of magnitude. Physical limitations will limit the line width to 0.2 micrometer.

During the same time the computer architectures have not improved in the use of silicon. On the contrary, most computers have been using more than optimal amount of silicon in order to be faster. Both these facts will stop the evolution of the speed of single processors in the next five years. Parallel processors are introduced at an increased price of the hardware because of rising complexity and, for most types of programs, a prohibitive increase of programming costs.

Seen in relation to each other, the hardware costs have shrunk but the programming costs of new systems have grown considerably and will coon be at a prohibitive level—there are not enough programmers in the world.

A computer is a complicated assembly of different units of software and hardware. Different paradigms and stages in the evolution have created standards—ad hoc and established—that are spread throughout the system. Because of this nonuniformity there are a great number of interfaces.

All these interfaces and paradigms of different quality have created a very great complexity.

Recently however so-called reduction processors are developing. A reduction processor includes an active storage, in which a program having a certain structure including arithmetic expressions is stored, and this structure is reduced in a number of reduction steps. Thus, the program is not executed in a given sequence as in other kinds of computers.

There have been some difficulties in developing reduction processors above a limited size.

OBJECTS OF THE INVENTION

The main object of the invention is to provide an associative memory including storage cells in which the associative search can be made on data elements placed in storage fields in the object storage cells having substantially arbitrary positions in the storage cells.

A further object of the invention is to provide an associative memory which may act as an active part of a computer and thus not only store information but to take part in logical operations as well.

Another object of the invention is to provide an active memory, below called object storage, particularly adapted to a reduction processor.

Another object of the invention is to provide an associative memory in which chosen parts of the cells may act as the associative part.

Still another object of the invention is to provide an associative memory in which the storage cells or storage fields of them could be marked to be available for operation or not.

Still another object of the invention is to provide an associative memory which can be implemented in the VLSI-techniques (VLSI=Very Large Scale Integration).

SUMMARY OF THE INVENTION

The attainment of the foregoing and other objects, the invention contemplates an associative memory having a first control bus arrangement for external control, a second memory bus arrangement for data including:

several storage cells for storing a composed information, means in each of said storage cells for storing at least one mark, said marks indicating at least the selected state(s) or non select state(s) for said storage cell, means for making search operations among said cells to set said marks, and a priority decoder to which all said storage cells are coupled and which selects one out of several of said storage cells.

At least on global bus is provided for making logical operations of the type AND and OR between said storage cells, and means in each storage cell for communicating with said buses and to control said storage cell to take part in an actual logical operation. Each storage cell includes preferably a number of data object storage fields, each being able to store a data word and at least one of said marks, being in form of tags. Each storage cell includes preferably at least one state storage field indicating the state or states of the content in said storage cell.

The fields of a storage cell are connected to at least one second bus, each being one bit wide, which buses being provided for making logical operations of the type WIRED AND or WIRED OR, the fields and the priority decoder being coupled to the second buses in order to read or write the content on the memory buses. The storage cells are controlled by an external control distributed to all the storage cells, data words being able to be transferred into or out of the memory be having an externally provided composed information provided on the memory bus connected to all the storage cells.

The invention also contemplates a storage bit call for an associative memory in which storage bit cell a value $V_{stores}$ is storable, the value being either 'true' or 'false', the storage bit cell having a structure such that it is settable in several different functional states and including a first connection which is constantly provided with a supply voltage, a second, a third and a fourth connection each of which is settable in at least three different control states, each combination of the control states on the second, third and fourth setting the storage bit cell in an individual among the functional states.

The storage bit cell is able to perform many functions even though it only includes four connections of which three are controllable. It includes very few components. This gives a possibility to make a compact storage device including a huge amount of bit cells.

Below follows a list on expressions used in this specification and their reserved meanings:

element: part of something larger in a data structure list: an ordered sequence of elements, each element could in turn be a list closure: a hierarchically structured entity which defines a process. All closures have a root which uniquely defines the closure. The reduction work in a reduction machine is made on closures. The whole state of the machine is transformed by the reductions storage bit cell: a cell in the memory storing only one piece of information, such as "0" or "1".

storage cell: a cell in an object storage including many bit cells. It stores a cell closure, which might refer to other cell closures stored in other storage cells cell closure: the content in a storage cell storage field: a field in a storage cell closure element: a data element stored in a storage cell field closure identifier: a closure cell element uniquely designating a closure canonical closure: a closure which cannot be further reduced, i.e. a cell closure which does not contain any closure identifiers designating some other cell closure which might be reduced in such a manner that this cell closure has to be further reduced goal: a closure to be executed, i.e. reduced father: a closure having at least one closure identifier in a value/designation field son: a closure linked to another closure through a closure identifier, which is designating the son A son could also be a father. A father could also be a son. A son could have more than one father. A father could have more than one son, typically most four sons.

closure position whether the closure is a root or a node root: the topmost closure cell in a closure tree node: a closure cell in a closure tree not being a root where: a storage cell field containing a closure position type: type code in a storage cell lazy: an element in a storage cell which indicates if the cell closure stored in the storage cell is executable or a postponed evaluation or inactive identifier: a special kind of closure element used to denote an object stored in a storage cell environment: objects may be grouped by giving them the same environment value/des.: a closure element storing either a value, i.e. a direct representation, nothing, or a designation to another closure, i.e. an indirect representation core cell: A structure arithmetic unit able to perform structure arithmetics involving reducing closures num word: the part of an element word representing a value or a designation tag word: the part of an element word having the tag indicating the feature of the representation in the num word object storage: memory including storage cells storing objects.

BRIEF DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENTS

Figure 1:
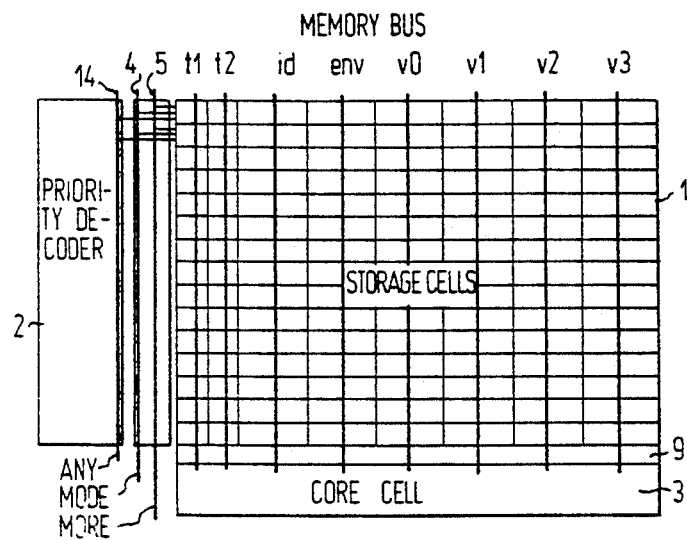
FIG. 1 illustrates schematically the design of an embodiment of the memory according to the invention.

The associative memory according to the invention is particularly suited to cooperate with a reduction type of computer. This kind of computer is described in the copending U.S. application Ser. No. 07/739,531. This kind of computer does not have any separate memories as commonly used. Instead the computer uses the memory according to the invention as a collection of active storage cells.

The strategy when deriving the associated memory according to the invention was to build a memory device as several storage cells. Each such storage cell should contain one cell closure or be a free unused storage cell. The storage cells should not be allocated in any particular order but should rather be assumed to be a pool of available resources.

It was deemed to be very important to have no physical address or dependence on the physical position. Such dependencies will sooner or later cause problems as in all conventional RAM type devices.

All storage cells communicate through a memory bus arrangement. This is important in order to decrease the cost. Other arrangements, such as using several ports etc, will increase the area of the memory. However, the memory bus arrangement can only perform one operation per memory cycle.

The reduction mechanism will have a state consisting of cell closures, each having an identifier, and where the cell closures, linked together by identifiers, form a graph. The graph could be followed by addressing closures by their identifiers. Therefore the memory bus will be used as a shared path for all vertices of the graph.

Each closure has an environment, which could include an identifier designating the root closure in a tree of closures providing the environment of the closure. In this way the whole structure is accessable from one closure in the tree, through the root, in one operation only. Closures could be grouped together by having the same environment.

All the "addressing" must be made according to content information because there are no physical dependencies, i.e. the memory is associative. A cell closure, i.e. the content in a storage cell, includes several storage elements, storable in storage fields in the storage cell. Each storage element is able to contain identifiers together with some label information. Each storage field is made associative. Therefore, there is no direction of information flow. It is possible to use the cell identifier, the cell environment, the cell type, the values written into the storage cell fields or combinations of them as search key.

The storage elements could include an extra select bit indicating that the storage element has been selected as a target for the access mechanism. Certain search operations set these select bits in the storage cell fields.

This type of access may involve one or several storage cells. One multiple cell operation could be to store an identifier in many selected storage elements belonging to different storage cells and stored in different fields in them.

When the memory according to the invention, below called object storage, is included in a reduction kind of computer, the reduction mechanism could have a state consisting of closures where identifiers form a graph. However, the basic reduction rules are so many that they could not be included into each storage cell. Therefore, the reduction mechanism is shared by all closures. A central control unit is used to make all the object storage cells in the object storage capable of driving long memory bus wires. The central control unit also has the possibility to adjust the bus signals both in time and in levels. The central control unit is not a part of the actual invention and will therefore not be described in detail.

An external control unit controls the function of the object storage. The memory bus communicates with all the storage cells. However, in some cases several storage cells will be ordered to be read out. In order to do so a mechanism is provided for selecting only one at the time of several available candidates. This is made by a priority decoder connected to all the cells.

Figure 5:
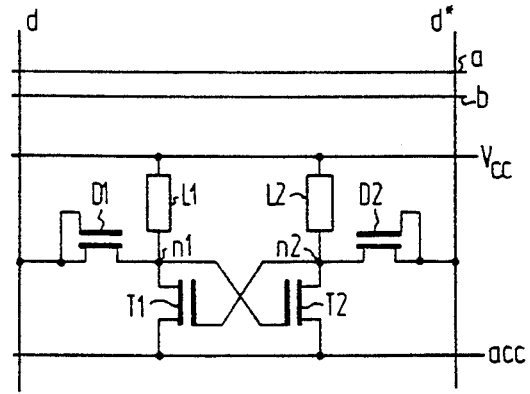
FIG. 5 is a circuit diagram of a first embodiment of a bit cell in a storage cell.
Figure 6:
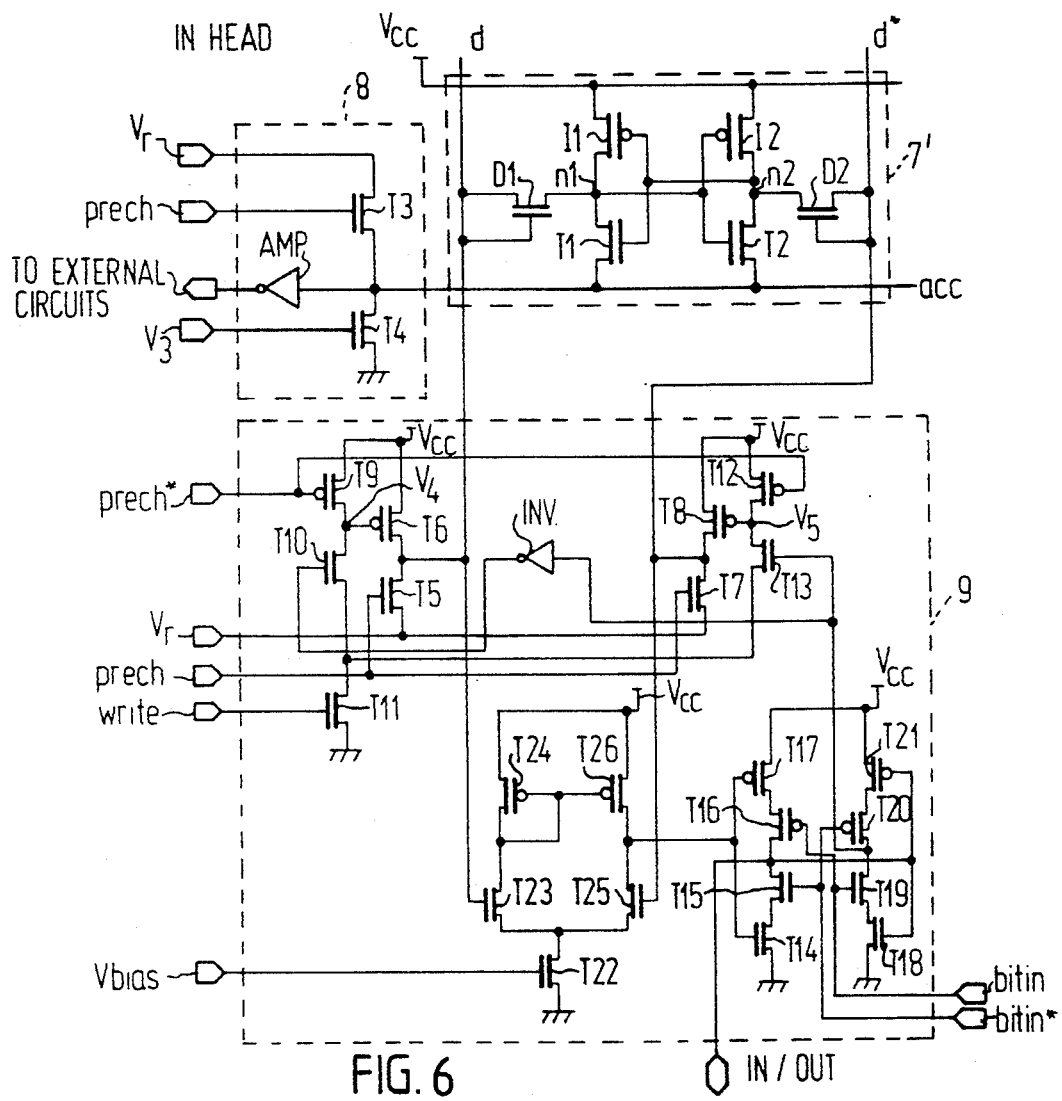
FIG. 6 is a circuit diagram of a bit cell in a storage cell and drive and sense circuits connected to it.

The object storage according to the invention has substantially more intelligence than an ordinary RAM type memory. It is associative which makes it possible to provide more services than "read" and "write" as provided by an ordinary RAM type memory and as will be explained further below. A bit cell structure particularly suited for the object storage is shown in FIGS. 5 and 6 and will be described further below.

The object storage is divided in storage cells, each including several storage fields. The provided services are on a high level. For instance, it is possible to find all occurrences of a particular data element whatever storage field it is stored in within the individual storage cells and to rewrite the found particular data element globally, i.e. within the whole object storage, to a new value using only one memory instruction. Since the object storage is associative this rewrite operation could be made in two physical memory cycles independent of the number of the affected storage cells.

With reference to FIG. 1, the memory, below called object storage, consist of a memory plane of rows of storage cells 1. Thus, the storage cells are provided as rows in a stack. They are all connected to a vertical memory bus t1, t2, id, env, v0, v1, v2, v3 driven by drive and sense amplifiers. An embodiment of such a circuit for one bit cell is shown in detail in FIG. 6. All storage cells are also connected to a priority decoder 2 selecting one storage cell at the time out of several storage cells to be operated. The memory is controlled by associative accesses performed during a session of some few cycles. A full object storage access is performed during a session.

A storage cell in the object storage according to the invention could be used both to store a digital content and to take active part in the actual computing. Composed digital information and at least one mark are stored in each storage cell 1. The marks are either CHOSEN or NON CHOSEN. The composed digital information in the storage cells or in parts of them, called storage fields, storing storage elements, can be read or written by reading or writing the information marked with marks having the value CHOSEN. Access may also be provided without having the mark bit involved. The access is then controlled by the result of a logic function on one bit buses a and b connected to the elements (see FIG. 2).

A central control unit (not shown) is provided as an external control, which takes part in search operations as well as in reading and writing information out of and into the storage cells. The central control unit, described in the copending U.S. application Ser. No. 07/739,531, which relates to a processor including an object storage, is not a part of the object storage according to the invention, and is therefore not described in detail. The central control unit is preferably a boolean gate array deriving input signals from the content in the storage cells and devices connected to the object storage, and provides control signals to the object storage in dependence of its input signals. However, it is to be noted that the object storage according to the invention could be cooperating with any processor of common type being provided with interfaces and control program adapted to the object storage.

The reductions in a reduction processor could preferably take place in a structural arithmetic unit, below called core cell 3, connected to all the storage cells in the object storage according to the invention with the memory bus arrangement. The memory bus arrangement can only perform one operation per memory cycle. This will be the simplest and therefore cheapest way to make such a connection. However, other arrangements could be used, such as using several ports etc, but such arrangements will give an increasing area to the memory. A word length of a storage cell could be quite long, for instance 238 bits. Therefore, the memory bus arrangement between the core cell and the storage cells could be divided into several bus sections, such as t1, t2, id, env, v0, v1, v2, v3, which could be awarded mutually different tasks. However, it is within the scope of invention to have a short word length of only a few bits, such a eight sixteen or thirty two bits and to have only one or a few marks. However, it is possible to reserve a field in the object storage for operations which could be made in a core cell, i.e. the core cell could be simulated in a part of the object storage. The core cell has several features to exchange and transfer data between its registers in one operation only. Such features will take several operation cycles in an object storage field simulating the core cell.

The global one bit buses 4, 5 are provided in order to make logical operations between the storage cells 1. These operations could be AND and OR. A third bus 14 could be provided connected to the priority decoder. However, the number of buses is not restricted to three but may be only one or several. The separate storage cells can read the buses 4, 5, and 14 and also take part in the logical operations. The bus 4 will have a signal 'true' if a test is going to be made on any of the buses a or b. The bus 4 (MODE) can be read and written to by all the storage cells. The bus 5 will have a value 'true' if MORE than one storage cell are chosen. The bus 14 will have a signal 'true' (i.e. "1") if ANY of the storage cells request communication.

Figure 2:
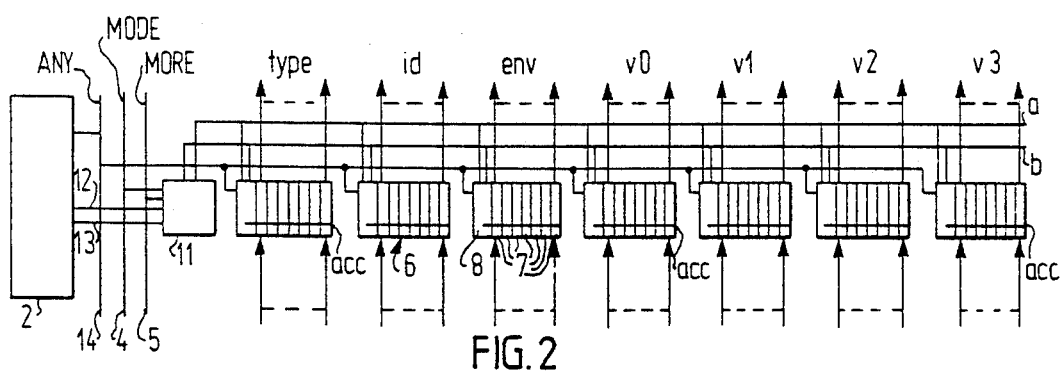
FIG. 2 illustrates schematically an embodiment of a storage cell in the memory according to the invention.

One storage cell is shown in FIG. 2. It is divided into several storage fields 6. Each storage field 6 includes several storage bit cells 7, below called bit cells, and an element head 8. Data representing a part of the composed digital information is stored in the bit cells 7 together with a mark representing CHOSEN or NOT CHOSEN stored in the element head 8. The storage fields could be awarded to mutually different tasks. The word length to be stored in each storage field could for instance be in the order of 38 bits. As an addition to the mark in the head 8 also some of the bits in bit cells 7 may be used as an information regarding the usage of the rest of the information in the storage field. Thus so called tag words may be placed in these bits. 6 bits may be used as tag words and 32 bits as normal, stored information in the bit cells 7. Each bit cell is connected to the drive and sense amplifiers (see FIG. 6) with two wires, such as the wires d and d* in the embodiment of a bit cell shown in FIG. 5. Thus, each part of an information bus going to an element for storing information being 38 bits long contains 76 wires. Each such bus part is connected to storage elements placed in a column in the storage cell area.

As apparent from FIG. 1, all the storage fields do not have to have the same size. Thus, the storage fields connected to the bus parts t1 and t2 are smaller than the storage fields connected to the rest of the bus parts. The element heads 8 of the storage fields 6 are connected to local one bit buses a and b of the storage cell. The number of these busses may be chosen in another way. The essential is that there is at least one bus. Logical operations of the kind WIRED AND and WIRED OR among CHOSEN of the storage fields are made using these buses.

As apparent from FIG. 2 each storage cell has a closure head 11 to which the buses a and b are connected. The closure head 11 is also connected tot he priority decoder with at least one bus one bit wide, which in the embodiment shown are two buses 12 and 13, and is also connected to the global buses 4 and 5. The closure head 11 serves as a buffer. The cells can read the result on these buses or take part in the logical operation.

The storage cells are controlled by the central control unit, through a control bus. Composed digital information can be exchanged between all the storage cells in the object storage and the core cell 3, via an interface of drive and sense amplifiers (see FIG. 6). An information on an external connection is written into the cells. An information in the cells is read from the cells to an external connection.

The bit cells 7 in each storage element can be controlled from its head 8 such that the bit cells can perform one at the time of the following operations:

rest: in which each bit cell keeps a stored bit value stored, read: in which stored bit values in the bit cells are read, write: in which bit values are written in the bit cells, compare: in which a data word composed by bit values stored in the bit cells is compared with another data word.

The control from the head 8 is dependent on logical conditions each being a function of data on the second buses a and b, earlier mark, the result of the comparison in case of the comparison operation and an external control signal to the object storage.

The mark is settable in dependence on logical conditions each being a function of data on the second buses a and b, earlier mark, the result of the comparison in case of the comparison operation and an external control signal to the object storage from the external central control unit (not shown).

Because there are no physical dependencies all 'addressing' must be according to content information, i.e. the object storage is associative. Therefore there is no explicit direction of information flow. It is possible to use the cell identifier, the environment, the type, the information value or combinations of them as a search key, as will be explained further below.

The mark bit or bits in an element stored in a storage field of a storage cell having the value CHOSEN indicates that the element has been selected as a target for the access mechanism. Certain search operations could be used to set the marks.

This type of access may involve one or several storage cells. One of these multiple cell operations is a kind of store operation that may store an identifier in may selected elements.

As apparent from FIG. 2, a wire acc connected to the head 8 interconnects all the bit cells within an element. As will be further explained in describing FIGS. 5 and 6, all the bit cells are controlled by signals on the wire acc. Each bit cell includes two wires d and d*, and these are connected to all the corresponding bit cells in the other storage cells in the object storage.

The priority decoder includes one section for each storage cell, each section having a first connection for REQUEST, on which a bit value 'true' represents NEED and a bit value 'false' NO NEED, and a second connection for GRANT, on which a bit value 'true' represents CHOSEN and 'false' NOT CHOSEN.

Figure 7A:
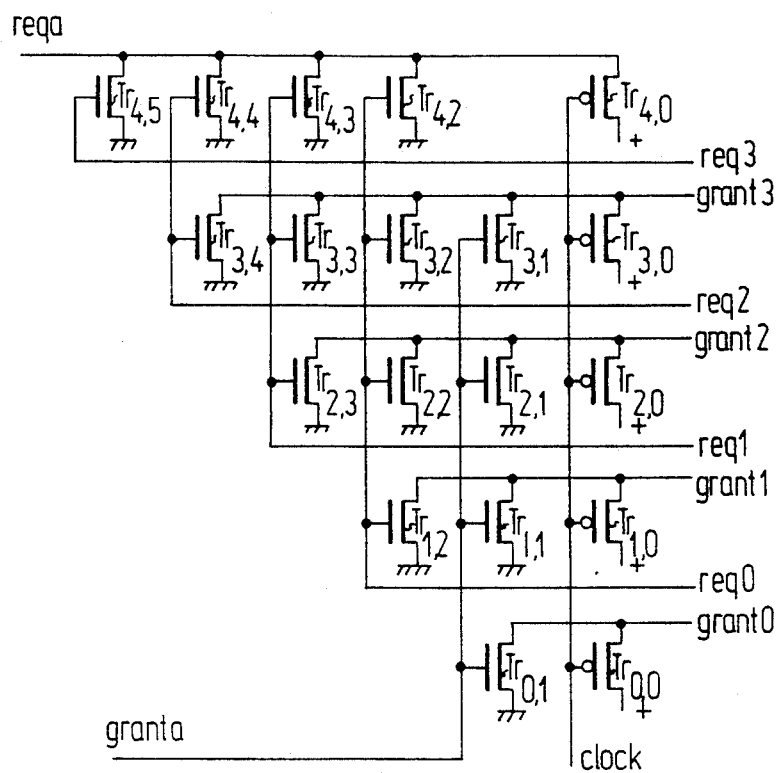
FIG. 7A is a circuit diagram of a block included in a priority decoder in the memory according to the invention.
Figure 7B:
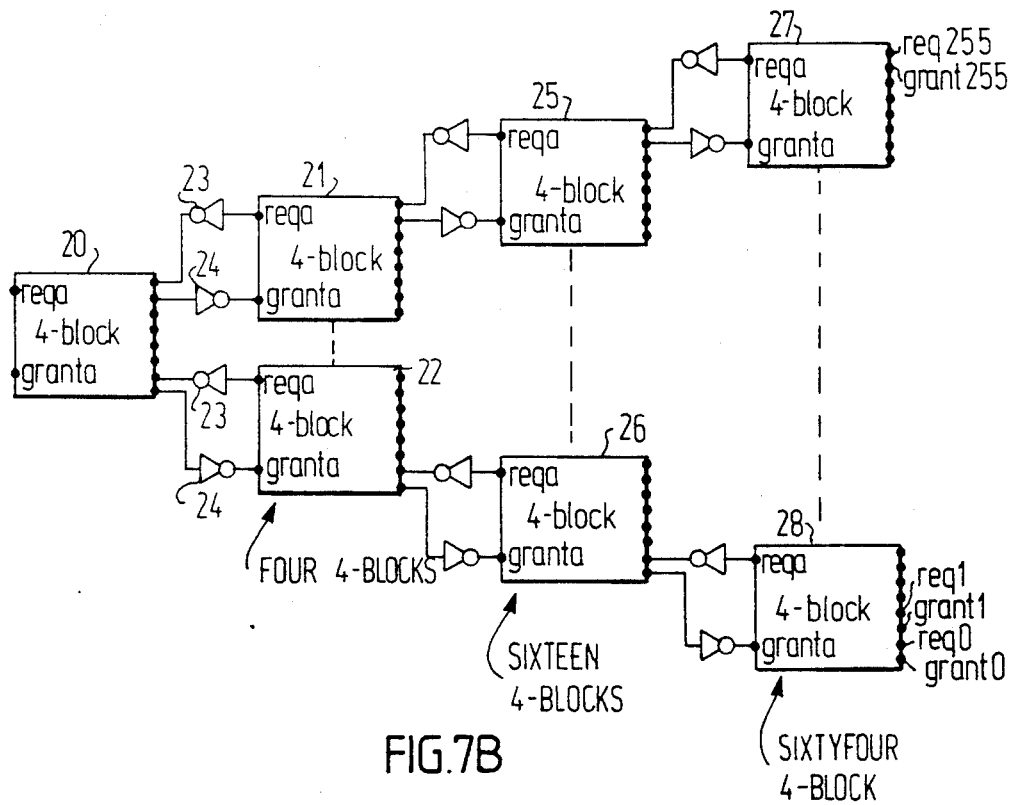
FIG. 7B illustrates connection of blocks shown in FIG. 7A.

The priority decoder 2 sets maximally one GIANT equal to CHOSEN for the storage cells which have REQUEST equal to NEED. This can be chosen such that the first section, measured in the structure, which has REQUEST equal to NEED will be CHOSEN. An embodiment of the priority decoder is shown in FIGS. 7A and 7B and will be described in further detail below.

In many cases the protocol on the object storage bus communicates with all the storage cells. However, in some cases several storage cells, or storage elements within storage cells, should be ordered and read out. This is made by the priority decoder 2. From each cell there is a REQUEST signal and the priority decoder 2 returns a GRANT signal.

The object storage is controlled with read, write and search operations. These operations can be combined to more complicated operations. Certain logical operations can be made on several among the internal buses a and b and on the global buses 4 and 5.

A search is made by making a comparison and to get the result FIT or DIFFERENT. The search can be made in one of the following ways:
(1) Search is made individually for each storage element and is independent of the composed information in other storage elements.
(2) Search can be made using a comparison to all storage elements in a storage cell. The result must be FIT in every element.
(3) Search can be made using a comparison to all storage elements in a storage cell. The result must be FIT in at least one of the storage elements.

A comparison can be made in one of the following ways:
(1) Two bit patterns are compared. A comparison results in FIT only when all corresponding bits are alike.
(2) The two bit patterns to be compared or only one of them are coded such that one of the bits states that the bit pattern information corresponds to an ARBITRARY or a SPECIFIC information value v. If, at a comparison, one of the information values corresponds to ARBITRARY then the result is FIT. Otherwise the result is FIT only when the two specific information values v are identical.

The bus function is performing the concept of reading or writing the object storage word. The bus is controlled by an access function. The access function depends on the mark and/or the value of the second buses a and b.

The WIRED OR function provided on the one bit bus a has a list of booleans. It evaluates a logical OR between all the storage elements in a storage cell. Physically it corresponds to a wire that is set by transistors located in the element heads 8.

The WIRED AND function provided on the one bit bus b has a list of booleans. It evaluates a logical AND between all the storage elements is set by transistors located in the element heads 8.

The priority function of the priority decoder 2 has a list of booleans as argument and results in a boolean list of the corresponding size. The argument has a first element which has the highest priority. After that bits with lower priority will follow. The first 'true' bit of the argument results in a corresponding true bit in the result. All other bits are 'false'.

The elements in the storage cells are generally used by first searching values in the elements and then operations such as read and write are performed in found elements.

Figure 3:
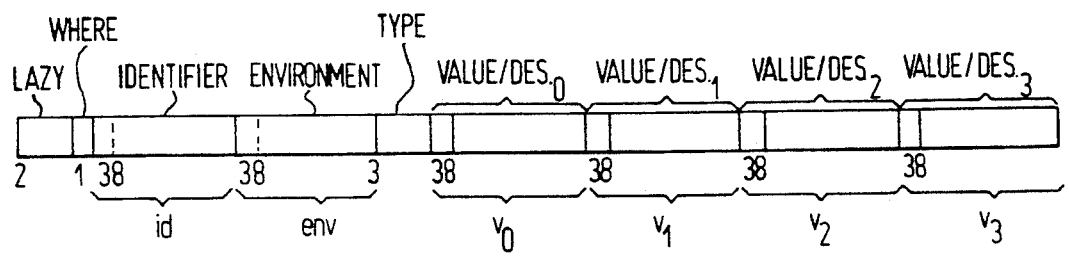
FIG. 3 is a schematic illustration of possible use of different storage fields in a storage cell.

An embodiment of a storage cell is shown diagramatically in FIG. 3, and will be used to explain the function of the different storage fields in a storage cell, as used in the object storage according to the invention. The fields in the storage cell in FIG. 3 do not have the same order and division as the fields in the storage cell in FIG. 2, because FIG. 2 shows the hardware and FIG. 3 the use of the storage cell. As illustrated in FIG. 3 the storage cell can store two types of storage elements and includes storage fields particularly adapted to the elements to be stored. These fields have been given the same names in FIG. 3 as the elements to be stored in them.

The first kind of elements describe different states of the storage cell. These elements could also be called state storage elements. One such element is LAZY, which denotes whether the cell is idle, in which case the remaining content of the cell is regarded as passive information, exec, i.e. is in an executable state, or wait, i.e. the evaluation of the cell has been postponed and it is waiting for a result before it can be executed. Another first kind of element is TYPE, which includes an type code (par, seq, apply, list etc). As apparent from FIG. 2, all the state storage elements could be provided in one storage field having the memory bus type, or as shown in FIG. 1 in two storage fields having the memory buses t1 and t2.

The second kind of elements describe identification, environment or value. These are IDENTITY, ENVIRONMENT, VALUE/DES. Each of these elements includes a core word, which in turn is divided into a num word and a tag word. These second kind of elements could also be called data object storage elements, because data objects are stored in them.

The tag word indicates the feature of the num word. The tag words are of two kinds, indirect tag words, i.e. tag words used for identifiers, environments and identifier designations, and direct tag words, i.e. tag words used for simple values or the like. Examples of indirect tag words are cls, canon, and open. If the rag word is cls it means that the num word in the identifier field represents a closure which might be reduceable. If the tag word is canon it means that the num word in the identifying field represents a closure which can not be further reduced. If the tag word is open it means that the identifier field represents a closure having inserted lists. Examples of direct tags are discr, cont, unused and nothing. If the tag word is discr it means that the num word is an integer. If the tag word is cont it means that the num word is a floating-point value. If the tag word is unused it means that the num word in the identifying field lacks meaning. If the tag word is nothing it means that the num word in the identifying field represents nothing, i.e. contradiction, e.g. a unification of a closure including a field marked nothing will always be nothing.

If the identifier field in a storage cell includes an identifier element the process state in that storage cell could be transferred to the core cell. Each storage cell could have a closure element in the fields VALUE/DES. linking the cell to another cell closure. The environment fields could include an identifier designating the root closure in the network part, i.e. tree, of closures providing the environment of the closure. However, The environment field could also have other uses. The environments could be used to keep track of the creator of a structure by storing the identifier of the creator in the environments of all cell closures created. For example all closure cells in a subtree, in which all symbols having the same name shall stand for the same thing, could be grouped by having the same environment. In this way it is able to get to the whole structure, through the root, in one operation only.

The designation function could be regarded as a directed link from a father to a son, i.e. a closure element is uniquely identifying a cell closure. The behaviour of a machine having an object storage of the associative kind is thus represented as a directional graph of closures.

Thus, if the environment of a closure is given, the root closure within this environment could be found. A root closure is provided with a particular mark (for instance "1") in the field WHERE in its storage cell. A node closure is provided with another mark (for instance "0") in the field WHERE.

Figure 4:
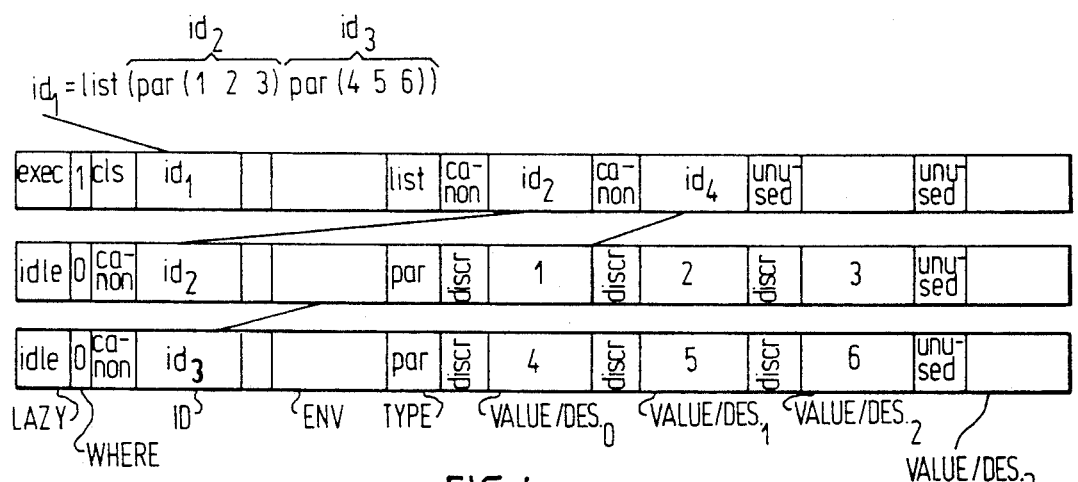
FIG. 4 is a schematic illustration of how storage cells in the object storage according to the invention can shown a function.

An example is shown in FIG. 4 of a storage cells storing the function $$id_1 = list(par(1\ 2\ 3)\ par(4\ 5\ 6))$$

which is a list of two parallel value combinations. The first parallel combination par(1 2 3) has the identity $id_2$, and the second parallel combination par(4 5 6) has the identity $id_3$. The root storage cell including the cell closure having the identity $id_1$ in the tree is tagged cls, has the rotation exec in the LAZY field, has a "1" set in the WHERE field, has the notation list in the TYPE field, and has $id_2$ and $id_3$ in the first two value/des. fields. The tags of these fields are therefore marked canon because the contents of these fields are indirect and linked to other closure cells. The node storage cell including the cell closure having the identity $id_2$ has a "0" set in the WHERE field, has the notation par in the TYPE field, and has the discrete values 1, 2, and 3 stored in the first three value/des. fields. The tags of these fields are therefore marked discr. The node storage cell including the cell closure having the identity $id_3$ has a "0" set in the WHERE field, has the notation par in the TYPE field, and has the discrete values 4, 5, and 6 stored in the first three value/des. fields. The tags of these fields are therefore also marked discr.

The whole object storage is intended to be implemented in the VLSI-techniques (VLSI=Very Large Scale Integration). Each bit cell has thus a design adapted to be implement in VLSI-techniques and is optimized for high packing density of a large amount of bit cells. As seen in FIG. 5 the bit cell has only four connections (wires), i.e. a first connection $V_{cc}$ which is constantly provided with a supply voltage, and a second, a third and a fourth connection, acc, d, d* each of which is settable in at least three different control states, as will be described in further detail later on.

The embodiment of the bit cell shown in FIG. 5 is a four transistor CMOS cell. The transistors are n-type transistors in the shown embodiment. However, the components in the bit cell circuit can be of many different kinds, which will be apparent from a list of components given below. The four transistor CMOS cell is static and has a resistive load. The cell is a flip-flop controllable from each side. Between the access wire acc and the supply wire $V_{cc}$ two series connections, each including the source/drain path of a MOS FET and a load T1,L1 and T2,L2, respectively, are provided in parallel. The drain of the transistor T1 is connected to the gate of the transistor T2, and the drain of the transistor T2 is connected to the gate of the transistor T1. A diode D1 is connected between the wire d and the interconnection n1 between the drain of the transistor T1, the load L1 and the gate of the transistor T2. A diode D2 is connected between the wire d* and the interconnection n2 between the drain of the transistor T2, the load L2 and the gate of the transistor T1. Each of the diodes D1 and D2 are provided by a MOS FET having the drain and gate connected to each other and connected to the wire d or d*, respectively.

The essential qualities of the circuit elements are that the diodes D1 and D2 are elements permitting current to flow only in one direction relative to the wires d and d*, and that the transistors are active elements in which the current can be controlled by variation of the potential of their gates. The interconnections n1 and n2 are nodes on which a potential related to a one bit information is storable. Each load is an element which behaves like a resistor.

In the embodiment in FIG. 5 the voltage $V_{cc}$ is shown to be a high potential. The diodes D1 and D2 are then directed such that current is flowing from the wire d or d* to the node n1 or n2, respectively. The resistance of the active elements T1 or T2 are lowered when the potential on the gate electrode is increasing and thus the nodes are then lowered. However, in other embodiments potential and currents could be chosen to have the opposite directions to the ones shown in the embodiment according to the FIG. 5.

The components in the circuit in FIG. 5 could be chosen in alot of different ways. The diodes D1 and D2 could be chosen among the following components:
  (1) n-channel MOS FET in which the drain and the gate are interconnected (positive voltages).
  (2) p-channel MOS FET in which the drain and the gate are interconnected (negative voltages).
  (3) pn-diode (positive voltages, negative voltages with the diode reversed).
  (4) Schottky-diode (positive voltages, negative voltages with the diode reversed.

As the active elements T1 and T2 the following components could be used:
  (1) n-channel MOS FET (positive voltages).
  (2) p-channel MOS FET (negative voltages).
  (3) npn transistor (positive voltages).
  (4) pnp transistor (negative voltages).

As the loads L1 and L2 the following components could be used:
  (1) a resistor.
  (2) n-channel enhancement type MOS FET having its drain and gate interconnected (positive voltages).
  (3) p-channel enhancement type MOS FET having its drain and gate interconnected (negative voltages).
  (4) n-channel depletion type MOS FET having its drain and gate interconnected (positive voltages).
  (5) p-channel depletion type MOS FET having its drain and gate interconnected (negative voltages).
  (6) n-channel MOS FET having its gate as a control electrode and the source and the drain as drive connections (positive voltages).
  (7) p-channel MOS FET having its gate as a control electrode and the source and the drain as drive connections (negative voltages).
  (8) npn transistor having the base as the control electrode and the emitter and collector as drive connections (positive voltages).
  (9) pnp transistor having the base as the control electrode and the emitter and collector as drive connections (negative voltages).

With positive and negative voltages is means that Vcc is positive or negative, respectively, in relation to ground. The expression "low" and "high" voltage used below thus being related to if the voltages in the bit cell are regarded as positive or negative, i.e. related to if the voltage Vcc on the first connection is positive or negative in relation to earth.

A second embodiment of the bit cell circuit, together with drivers for the bit cell wires d, d* and acc, is shown in FIG. 6. Elements corresponding to elements in FIG. 5 have the same reference numerals. The bit cell 7' is shown surrounded by dashed lines. The load is the source/drain path of a MOS FET l1 and l2, respectively, shown to be of p-type in this embodiment, i.e. the opposite type of the type of the transistors T1 and T2 shown to be of n-type in this embodiment. The gate of the transistor I1 is connected to the node n2, and the gate of the transistor I2 is connected to the node n1.

Regarding the bit cell embodiments both in FIG. 5 and in FIG. 6, the bit cell can store a value $V_{store}$, the value being either 'true' or 'false'. The bit cell has a structure such that it is settable in several different functional states by setting different potentials on the wires acc, d and d*.

The control states are high level, low level, current into cell for all the wires and also current out of cell for the wire acc. The wire acc is an access wire going from the head 8 and connected to all the bit cells 7 in a storage element. The third and fourth wires d and d* have signals inverted to each other when writing or reading of the cells is made and the access wire acc is LOW.

The driver and sense amplifiers in the head 8 is illustrated schematically in a dashed square in FIG. 6. The control of the access wire acc is made in the head 8, which in turn is controlled from the external central control unit, which provides the voltages Vr and V3, and also a precharge signal prech. A first transistor T3, in this embodiment shown as being of n-type, has its source connected to a voltage Vr, its drain to the access wire acc in all the bit cells 7' in a storage cell and its gate is fed with the precharge signal prech, which could be regarded as a clock signal. A second transistor T4, in this embodiment shown as being of n-type, has its source connected to a voltage 0 V, its drain to the access wire acc in all the bit cells 7' in a storage cell and its gate is controlled by an external control, which sets a voltage V3 which will be high when the voltage 0 V shall be set on the access wire acc. As mentioned above the wire acc will be connected to all the bit cells in a storage cell, and all the bit cells will thus have the same control regarding the wire acc. For controlling the wire acc a precharge is made in a first phase, controlling the MOS FET T3 to its conducting state and thus setting the wire acc on the voltage Vr. In the next phase the signal V3, being either high or low depending upon the kind of control to be made, low or high voltage for the wire acc, is fed to the MOS FET T4. The voltage level of the wire acc is amplified in an amplifier AMP and transferred to the external circuits for further operation.

Figure 8:
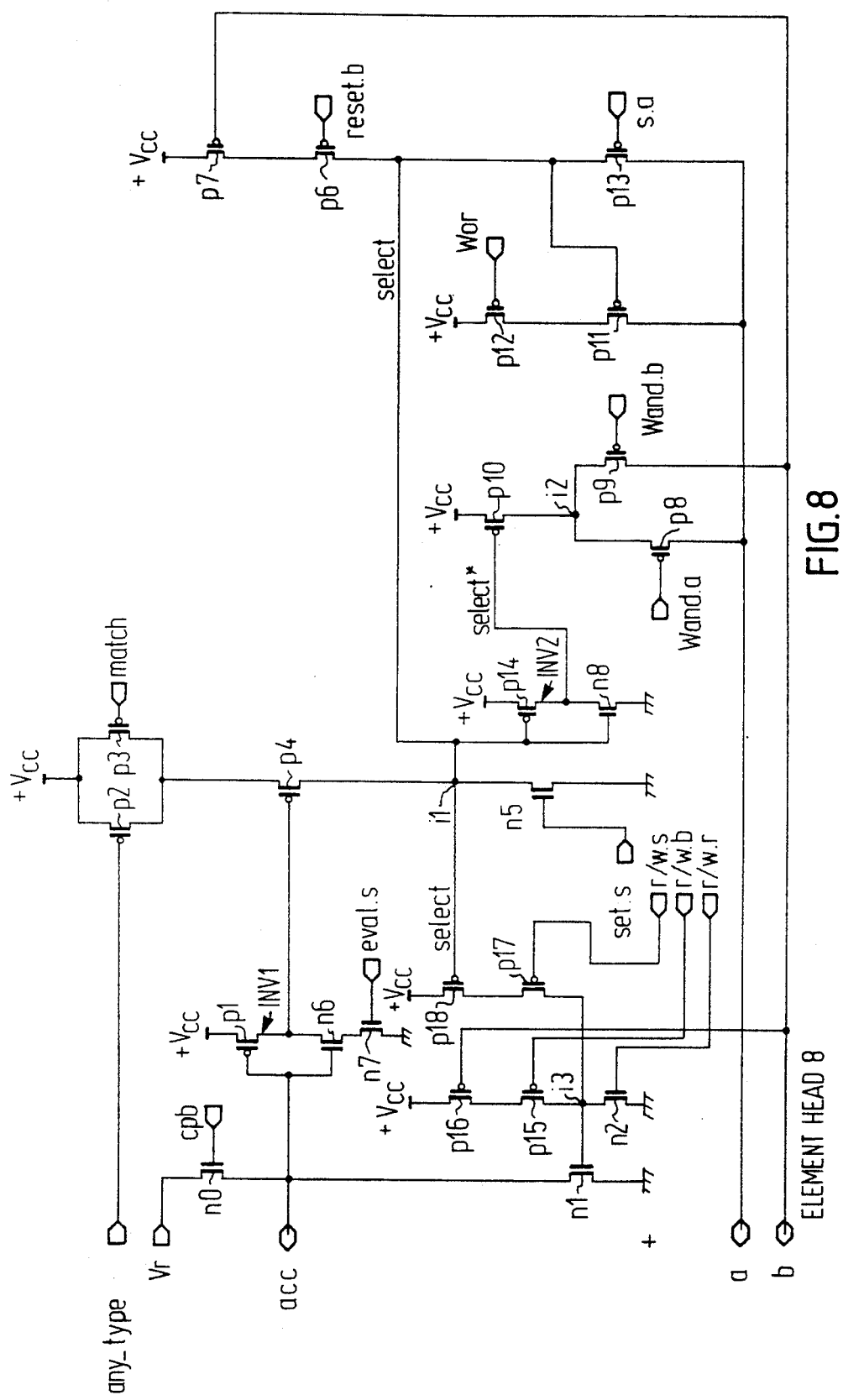
FIG. 8 is a circuit diagram of an embodiment of an element head in the memory according to the invention.

An embodiment of the whole element head is shown in FIG. 8 and will be described further below. The provision of the control signals to the head 8, as well as to the drive and sense circuit 9 described below, is not a part of this invention and will therefore not be further described.

An embodiment of a drive and sense circuit 9 for the bit cell wires d and d* is illustrated schematically in another dashed square in FIG. 6. However, it is to be noted that the circuit 9 only illustrates one possible way to drive and sense the wires d and d*. The input/output IN/OUT is connected to the core cell 3 shown in FIG. 1. Thus, the circuit 9 is one of many similar circuits that could be provided in an interface between the object storage 1 and the core cell 3.

The write circuit for the wire d includes a first pair of transistors T5 and T6, the first shown to be of n-type and the second of p-type in the embodiment, having their drains connected to the wire d, and providing a voltage divider. The transistor T5 has its source connected to a potential Vr, and its gate is fed with the precharge signal prech. The other transistor T6 has its source connected to a potential Vcc, and its gate is fed with a control signal V4 going low when the potential Vcc shall be fed to the wire d as will be explained further below. The write circuit for the wire d also includes a series connection of the source/drain paths of a p-type transistor T9 and a n-type transistor T10 connected between the voltage source Vcc and the drain of a n-type transistor T11 having its source connected to ground and its gate connected to an input write from the external control. The interconnection between the drains of the transistors T9 and T10 is connected to the gate of the transistor T6 and bears the voltage V4. The gate of the transistor T9 is fed with the inverted precharge signal prech* connecting the gate of the transistor T6 to the source voltage Vcc through a conducting transistor T9 during the precharge phase.

The write circuit for the wire d* includes a second pair of series coupled transistors T7 and T8, the first shown to be of n-type and the second of p-type in the embodiment, having their drains connected to the wire d*, and also providing a voltage divider. The transistor T7 has its source connected to a potential Vr, and its gate is fed with the precharge signal prech. The other transistor T8 has its drain connected to a potential Vcc, and its gate is fed with a control signal V5 going low when the potential Vcc shall be fed to the wire d*.

The write circuit for the wire d* also includes a series connection of the source/drain paths of a p-type transistor T12 and a n-type transistor T13 connected between the voltage source Vcc and the drain of the transistor T11. The interconnection between the drains of the transistors T12 and T13 is connected to the gate of the transistor T8 and bears the voltage V3. The gate of the transistor T12 is fed with the inverted precharge signal prech* connecting the gate of the transistor T8 to the source voltage Vcc through a conducting transistor T12 during the precharge phase.

The external wire IN/OUT for input and output is connected to two tristate inverters. One of the tristate inverters having its output connected to the wire IN/OUT includes a series connection of the source/drain paths of two n-type transistors T14, T15 and two p-type transistors T16, T17. The gate of the transistor T16 is connected to an external control wire providing the signal bitin and the gate of the transistor T15 is fed with the inverted signal bitin*. The second of the tristate inverters having its input connected to the wire IN/OUT includes a series connection of the source/drain paths of two n-type transistors T18, T19 and two p-type transistors T20, T21. The gate of the transistor T19 is connected to the external control wire providing the signal bitin and the gate of the transistor T20 is fed with the inverted signal bitin*. The output of the second tristate inverter is connected to the gate of the transistor T13 and through an inverter INV to the gate of the transistor T10.

A read amplifier including a n-type transistor T22 having its source connected to earth, its gate connected to a constant voltage Vbias which holds the transistor T22 constantly conducting and functioning as a current generator, and its drain connected to a parallel connection of two series connected source/drain paths of a n-type transistor and a p-type transistor, T23, T24 and T25, T26, respectively, having their other end connected to the source voltage Vcc. The gates of the p-type transistors T24 and T25 are interconnected and connected to the interconnection of the drains of the transistors T23 and T24. The gate of the transistor T23 is connected to the wire d of the bit cell 7', and the gate of the transistor T25 is connected to the wire d*.

Each clock period, the signals prech and prech*, is divided into a precharge phase, in which the signal prech is high, and a make phase, in which the signal prech is low and he other control signals from the external control determines the operation to be made. Thus, at the precharge phase the wires d, d* and acc are precharged to the voltage Vr, through the transistors T5, T7 and T3, respectively.

The signals bitin and bitin* controls when data will be sent to and from the bit cell 7'. When the signal bitin is low and the signal bitin* high, then data will be transferred from the bit cell to the wire IN/OUT by the first tristate inverter. When the signal bitin is high and the signal bitin* low, then data will be transferred to the bit cell from the wire IN/OUT by the second tristate inverter.

At the read operation in phase two, after the precharge of the wires d, d* and acc to Vr, the wires d and d* are left floating, and the wire acc is set to the voltage 0 V by a high voltage V3 making the transistor T4 conducting. This causes the node having the lowest potential, say n1, to be lowered to a potential between Vr and 0 V. Because of this a current is flowing from the wire d to the node n1 to the wire acc. This current discharges the the wire d, i.e. the voltage on the wire d is lowered. This voltage reduction is measured by the read amplifier T22 to T26. The result of the reading is provided on the interconnection between the drains of the transistors T25 and T26 and fed to the input of the first tristate inverter T14 to T17. The signal bitin being low and the signal bitin* being high provides a transfer of the read and amplified bit value to the input/output wire IN/OUT. It is important that the wires d and d* are not driven in an active way during the phase two, since then no voltage reduction should be obtained on one of the wires.

Thus, for the read operation both d and d* are initially provided on the potential Vr. Both d and d* are substantially kept on the potential Vr, but one of them falls somewhat because of "current in" into the cell which discharges one of the wires d, d*. Since Vr here is defined as "low", the low potential will be lower than "low". d and d* give the read values. d lower than d* gives FALSE, d higher than d* TRUE. For the don't write, write false, write true, don't write and don't comp. operations the information potentials on the wires d and d* don't give any information.

For a write operation in phase two, after the precharge of the wires d, d* and acc to Vr, the wire acc is set to the voltage 0 V by a high voltage V3 making the transistor T4 conducting. The value to be stored is provided on the input/output wire IN/OUT. The signals bitin high and bitin* low activate the second tristate inverter T18 to T21 to transfer the value on the wire IN/OUT to its output. The control signal write being high on the gate of the transistor T11 connects the sources of the transistors T10 and T13 to 0 V.

A high signal from the second tristate inverter T18 to T21, i.e. a "0" or false to be written, controls the transistor T13 to conducting state, setting the voltage V5 to low voltage, the transistor T8 is controlled to be conducting and the wire d* is set to the voltage Vcc, i.e. high. The inverted signal from the second tristate inverter fed to the gate of the transistor T10, being low, will keep it non-conducting, the voltage V4 being connected to the voltage source Vcc during the precharge phase will be kept on this voltage. The transistor T6 will be kept non-conducting, and the voltage Vr connected to the wire d during the precharge interval through the transistor T5 will be kept.

A low signal from the second tristate inverter T18 to T21, i.e. a "1" or true to be written, will control the write circuit T5, T6, T9, T10 for the wire d to set it on the high voltage Vcc through the inverter INV while the write circuit T7, T8, T12, T13 will keep the wire d* on the voltage Vr it was set on during the precharge phase.

As apparent from the examples above, the storage nodes n1 and n2 are int he embodiment shown in FIG. 6 used in the following way of operation. One of the nodes n1, n2 or both are charged or discharged during the second phase of the operation cycle dependent upon which ones of the control signals V3, V4 and V5 to be used, i.e. if the wire acc i set on 0 V or if one of (or both) the wires d and d* is set on Vcc.

As mentioned above, every operation cycle is composed of a precharging period and an execution period. Thus, when it is mentioned below that the wire acc is set high it is meant that the signal V3 is not controlling the transistor T4 to set the voltage 0 V on the wire acc during the execution period. Likewise, when it is mentioned below that the wire d or d* is set low it is meant that the control signal V4 or V5 is not controlling the transistor T5 or T8 to be in a state coupling through the voltage Vcc, being higher than the voltage Vr, to the wire d or d* during the execution period. However, when the wire d or d* is set high then the transistor T6 or T8 will be controlled to connect through the voltage Vcc to the wire.

The storage cell area could be rather extensive, for instance including 256 storage cells, which means that each pair of transistors T5, T6 and T7, T8, respectively, is connected to a wire serving one bit cell in all the storage cells, such as 256 bit cells. Therefore, the transistor sizes must be adjusted to the total bus capacitances and the desired speed.

The voltage Vr could be created from a shorted inverter in order to keep a known relation between Vr and the sense amplifier inverter. The access circuits in the head shall control the bit cells and also capture the information from the bit cells.

The following functional states are settable by the control states:
rest: the cell is just storing the value vstore,
read false: the value vstore=false can be read,
read true: the value vstore=true can be read,
don't read: the cell is just storing the value vstore,
write false: the stored value vstore is set to 'false'.
write true: the stored value vstore is set to 'true',
don't write: the cell is just storing the value vstore,
comp. false: the stored value vstore is compared to a value 'false',
comp. true: the stored value vstore is compared to a value 'true',
don't comp.: the cell is just storing the value vstore.

The following is an operation table for different operation modes of a bit cell:

| Op. mode    | acc  | d          | d*         |
|-------------|------|------------|------------|
| rest        | low  | low        | low        |
| read false  | low  | current in | high       |
| read true   | low  | high       | current in |
| don't read  | high | arbitrary  | arbitrary  |
| write false | low  | low        | high       |
| write true  | low  | high       | low        |
| don't write | high | arbitrary  | arbitrary  |

-continued

| Op. mode | acc | d | d* |
|---|---|---|---|
| comp. false | arbitrary | low | high |
| comp. true | arbitrary | high | low |
| don't comp. | arbitrary | low | low |

For comp. false and comp. true the wire acc should have the state current out if a comparison result is DIFFERENT.

For the comp. false or comp. true operations the wire acc (access wire) gives the result of the comparison. The wire acc is precharged to Vr and the input data is supplied on the wire d, and its inverse value on the wire d*. If the value stored in the bit cell is different than the input data, the wire acc will be charged through one of the diodes D1 or D2, and through the corresponding n-type transistor, T1 or T2. This is detected by the amplifier AMP in the head 8. When a compared FIT is detected the wire acc will be kept on the potential Vr.

The expressions current in and current out expresses that a charge is moved into and out of, respectively, the wire in question during a time sequence. This is usually made by initiating the wire to HIGH or LOW, respectively, in the operation mode REST and then change into the actual mode. A current will then discharge or charge, respectively, the wire in question. When there is no current no appreciable charge will be transported. Therefore, no voltage change will be provided during the time sequence.

The embodiment of the priority decoder 2 shown in FIGS. 7A and 7B is divided into 4-blocks. As shown in FIG. 7A, each 4-block has one pair of left hand side wires granta and reqa and four pair of right hand side wires req0, grant0, ... to ... req3, grant3.

As shown in FIG. 7B, a first 4-block 20 has its four pairs of right hand side wires connected to each of the pair of left hand side wires of four 4-blocks, of which the outer ones 21 and 22 are shown. The blocks 20, 21, and the blocks 20, 22 are interconnected with inverting amplifiers 23 and 24, the amplifier 23 giving information to a block lower int he block chain that a priority require is needed for a block higher in the chain, and the amplifier 24 giving information to a block higher in the block chain that a grant is given. The number of blocks 21, ... 22 in the second 4-block column are thus four.

Each block in the second column is then connected to four 4-blocks in the third column of blocks in the same way as the blocks in the second column are connected to the 4-block 20. The number of 4-blocks in the third column will then be sixteen. Only the outermost 4-blocks 25 and 26 are shown.

Each block in the third column is then connected to four 4-blocks in the fourth column of blocks int he same way. The number of 4-blocks in the third column will then be sixty four. Only the outermost 4-blocks 27 and 28 are shown.

The right hand side wires of the 4-blocks in the fourth column are connected to the object storage. Each pair being adapted to serve as the buses 12 and 13 for a storage cell 1, as apparent from FIG. 7B.

Eighty five blocks are provided to serve 256 closures. The lowest block 28 is serving the lowest storage cells, down to the storage cell number 0, and the highest block 27 is serving the highest, i.e. up to the storage cell number 255.

The configuration shown in FIGS. 7A and 7B uses a domino precharged logic, where the full priority decoder includes cascaded domino stages, corresponding to a transfer of a request signal from for instance req0 in the lowest block 28, through all priority decoder blocks and back to give a false grant signal to all storage cells, except the storage cell number 0.

As shown in FIG. 7A, each block includes 5 rows of MOS FET transistors, each row including one MOS FET more than the row below, except for the fifth row which has the same number of MOS FET as the fourth row.

Each of the MOS FETs $Tr_{0,0}$ to $TR_{3,0}$ most to the right in the four lowest rows is shown to be of p-type having its gate connected to a clock signal source, its drain connected to a positive supply voltage and its source connected to the grant wire grant0, grant1, grant2 or grant3, respectively. The MOS FET $Tr_{4,0}$ in the highest row has its source, instead of being connected to a wire granti, i being a number between 0 and 3, connected to a wire reqa connected to the next lower block in the block cascade through an inverter 23.

The rest of the MOS FETs, shown to be of n-type, $Tr_{0,1}$ in the first row, $Tr_{1,1}$ and $Tr_{1,2}$ in the second row, $Tr_{2,1}$, $Tr_{2,2}$ and $Tr_{2,3}$ in the third row, $Tr_{3,1}$, $Tr_{3,2}$, $Tr_{3,3}$ and $Tr_{3,4}$ in the fourth row, $Tr_{4,2}$, $Tr_{4,3}$, $Tr_{4,4}$ and $Tr_{4,5}$ in the fifth row, have their sources connected to earth and their drains connected to a grant wire grant0, grant1, grant2, or grant3, respectively, for the four lowest rows and to the wire reqa for the fifth row.

The wire granta is connected to the gate of each of the MOS FETs $Tr_{0,1}$, $Tr_{1,16}$ $Tr_{3,1}$. The wire req0 is connected to the gate of each of the MOS FETs $Tr_{1,2}$, $Tr_{2,2}$, $Tr_{3,2}$ and $Tr_{4,2}$. The wire req1 is connected to the gate of each of the MOS FETs $Tr_{2,3}$, $Tr_{3,3}$ and $Tr_{4,3}$. The wire req2 is connected to the gate of each of the MOS FETs $Tr_{3,4}$ and $Tr_{4,4}$. The wire req3 is connected to the gate of the MOS FET $Tr_{4,5}$.

The priority decoder operates in two phases. In the first phase, when the clock signal is low, all granti are precharged to be high (true). Then all the signals reqi will be low (no need). In the second phase the precharge is closed, i.e. the clock signal will be high. Then any or some of the outputs reqi will go high, which sets all the granti above to low (not chosen) and sets reqa to low. If a reqa goes low, then a reqi in a neighbouring 4-block to the left in FIG. 7 is set to high. The signals reqa and granta in the 4-block 20 are of no importance. However, grant_a in the 4-block 20 is connected to earth. The signal reqa in the 4-block 20 provides the result "ANY" on the wire 14 in FIGS. 1 and 2, since it has to go low when any reqi connected to any of the cell closures goes high.

A detail embodiment of the element head 8 is shown in FIG. 8. This embodiment is adapted to the application of the object storage in a reduction kind of processor. The element head 8 controls the access wire acc to the storage cells 7, it sensed the access wire acc and wire ANY 14, here called any type, it performs the operations wired_and and wired_nor on the buses a and b, and it also reads the buses a and b. Furthermore, it includes an internal dynamic memory bit.

A n-channel MOS FET n0 has its source/drain path connected between a voltage Vr, being the same as the voltage Vr in FIG. 6, and the access wire acc. A clock pulse cpb is fed to the gate of the MOS FET n0. A n-channel MOS FET n1 has its source/drain path connected between earth and the access wire acc.

A series connection of the parallel coupled source/drain paths of two p-channel MOS FETs p2 and p3, the source/drain path of a p-channel MOS FET p4, and the drain/source path of a n-channel MOS FET n5 is connected between a voltage source Vcc and earth.

A wire any_type directly connected to the nearest bit cell is connected to the gate of the MOS FET p2. A wire match from the central control unit (not shown) is connected to the gate of the MOS FET p3. The access wire acc is via an inverter INV 1 including the series connected source/drain paths of a p-channel MOS FET p1 and a n-channel MOS FET n6 having their gates connected to the access wire acc. connected to the gate of the MOS FET p4. A n-channel MOS FET n7 has its source/drain path connected between the inverter INV1 and earth. A wire eval.s, i.e. evaluate select, from the central control unit is connected to the gate of the MOS FET n7. A wire set.s, i.e. set select, from the central control unit is connected to the gate of the MOS FET n5.

The interconnection point i1, also called the select node, between the drains of the MOS FETs p4 and n5 is connected to the drain of a p-channel MOS FET p6, having its source connected via the drain/source path of a p-channel MOS FET p7 to the voltage source +Vcc. A wire reset.b from the central control unit is connected to the gate of the MOS FET p6. A wire b, which is the same as the wire b shown in FIG. 2, is connected to the gate of the MOS FET p7.

A p-channel MOS FET p8 has its drain connected to a wire, which is the same as the wire a shown in FIG. 2, and its source to an interconnection point i2. A wire Wand.a, i.e. wired and a, from the central control unit is connected to its inverted gate. A p-channel MOS FET p9 has its drain connected to the wire b, and its source to the interconnection point i2. A wire Wand.b, i.e. wired_and i3b, from the central control unit is connected to its inverted gate. A p-channel MOS FET p10 has its drain connected to the interconnection point i2 and its source connected to the source voltage +Vcc. The interconnection point i1 is via and inverter INV2 connected to the inverted gate of the MOS FET p10. The inverter INV2 includes the series connected source/drain paths of a p-channel MOS FET p14 and a n-channel MOS FET n8 connected between the voltage source +Vcc and earth and having their gates connected to the interconnection point i1.

A series connection of the drain/source paths of two p-channel MOS FETs p11 and p12 is connected between the wire a and the voltage source +Vcc. A wire Wor, i.e. wired or, from the central control unit is connected to the gate of the MOS FET p12. The interconnection point i1 is connected to the gate of the MOS FET p11. A p-channel MOS FET p13 has its source/drain path connected between the wire a and the interconnection point i1. A wire s.a, i.e. select a, from the central control unit is connected to the gate of the MOS FET p13.

A series connection of the drain/source paths of a n-channel MOS FET n2, a p-channel MOS FET p15, a p-channel MOS FET p16 is connected between earth and the voltage source +Vcc. An interconnection point i3 between the sources of the MOS FETs n2 and p15 is connected to the gate of the MOS FET n1. A series connection of two p-channel MOS FETs p17 and p18 is connected between the interconnection point i3 and the voltage source +Vcc. The interconnection point i1, the select node, is connected to the gate of the MOS FET 18. A wire r/w.b, i.e. read/write b, from the central control unit is connected to the inverted gate of the MOS FET p15. A wire r/w.s, i.e. read/write select, from the central control unit is connected to the gate of the MOS FET p17. A wire r/w.r, i.e. read/write reset, which is used to reset the node i3 after a read or write operation, from the central control unit is connected to the gate of the MOS FET n2.

The function of the logic in the embodiment of the element head shown in FIG. 8 is the following. The MOS FET no precharges the access wire acc at each negative clock pulse, and the MOS FET n1 evaluates it low at read or write. The MOS FET n2 precharges i3 low to keep the MOS FET n1 off, i.e. non-conducting, at stand-by.

The MOS FETs p17 and p18 perform read/write controlled by the select node. This is used for instance in instructions of type instruction match, clearing the mark of a closure cell or reading the identity of the closure cell and if not setting a mark, where different actions shall take place depending on the information on the buses a and b.

A match function compares a value, for instance a so called goal value, in the core cell and in a storage cell and consider these values defining two sets. The match result is false if the sets do not intersect. This case is also assumed if part of the closure are not fully evaluated.

The MOS FET n5 precharges the select node i1, and the MOS FETs p2 to p4 evaluate it an control from the external control unit on the gate of the MOS FET n7. The MOS FETs p8 to p10 perform wired-and on the bus a and/or on the bus b in dependence of the control signals from the central control unit. The MOS FETs p11 and p12 perform wired_or on the bus a at control from the central control unit.

The inverter INV2 inverts the select bit on the select node. This is necessary because both wired-or and wired-and are performed. The MOS FET p13 transfers the value on the bus a to the select node. Only a high state need be transferred, since it has been precharged to a low state. Finally, the MOS FETs p6 and p7 are used to select high when controlled. This is needed for an instruction for reading a marked storage cell and clearing the mark of that cell, because then the select node shall be reset at the same time as a reading is performed. This feature could also be used for other types of instructions in which a logical AND operation must be performed in the element head.

The signal any type is directly connected to the nearest bit cell. It contains the type of the stored value. During a match the MOS FET p3 is controlled to be off, so a high value on the wire having the signal any_type will generate a true match. Similarly, for a test of whether the storage cell is unused, a high state on the wire having the signal any_type while the MOS FET p3 is controlled to be off will cause the signal select on the select node to remain low. For a test regarding equality the MOS FET p3 is controlled to be on, i.e. conducting.

Figure 9:
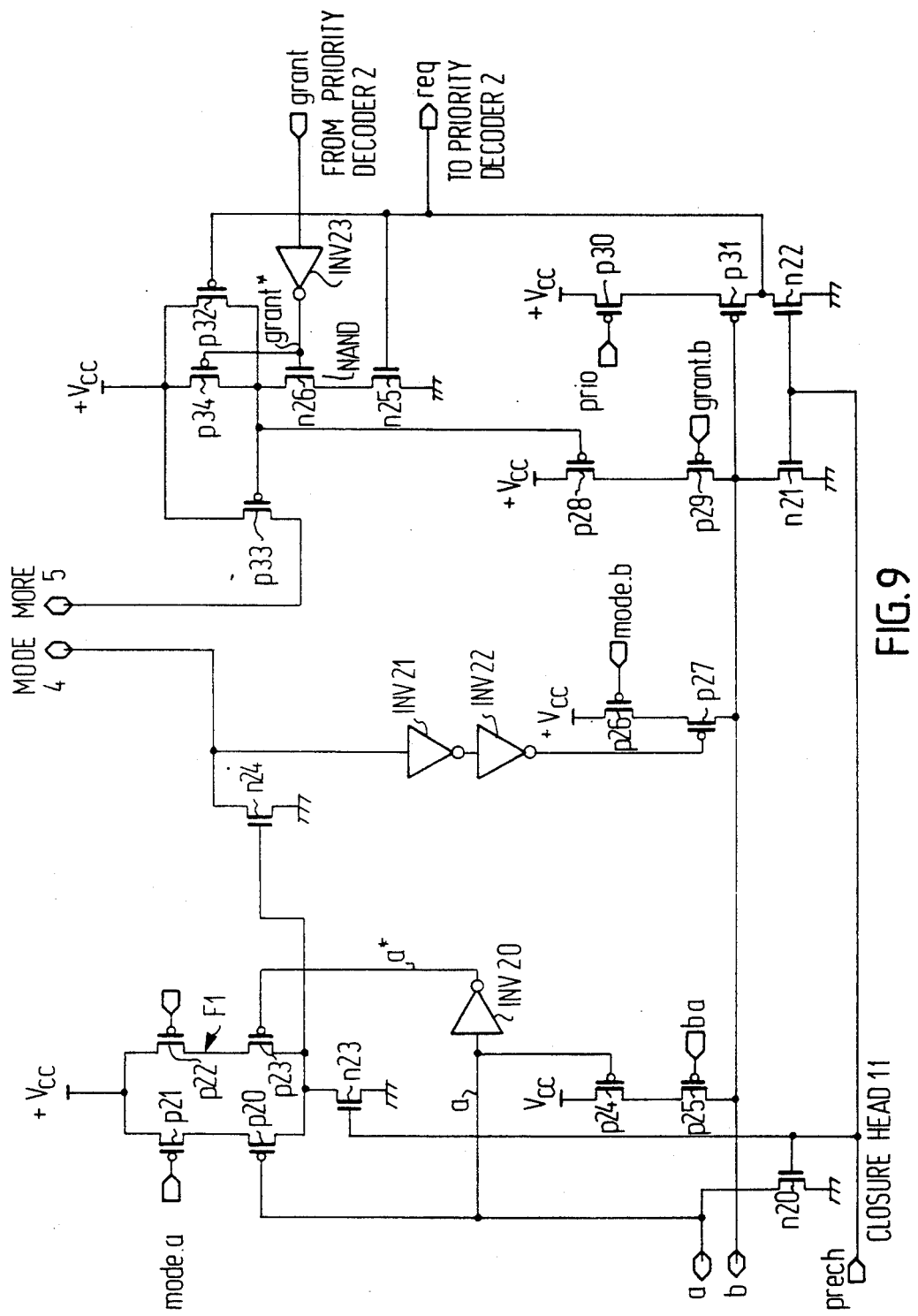
FIG. 9 is a circuit diagram of an embodiment of a closure head in the memory according to the invention.

The embodiment of a closure head 11 shown in FIG. 9 is able to perform the priority operation and the MODE operation on either the bus a or the bus b. Also this embodiment is adapted to cooperation with a reduction type of computer. Both operations can be performed simultaneously on different buses. The MODE operation, i.e. the operation of the bus 4 (MODE) in the circuit shown in FIGS. 1 and 2, is sensitive to either high or low states on the bus a, while it is sensitive only to the low state on the bus b. The closure head can also reset the global signal MORE on the bus 5 (see FIG. 1), and read and write back old bus data to the buses a and b.

Both the circuit to perform the MODE operation and the circuit to perform the priority operation are designed according to a two stage domino principle. The first stage determines which bus should be the input and correct the polarity, and the second stage performs the actual operation. Thus, the closure head operates in two phases, having a first precharge phase, and a second operation phase. Therefore, a number of precharge n-channel MOS FETs n20, n21, n22 and n23 are provided having their gate controlled by a clock signal prech from the central control unit. n20 precharges the bus a, n21 the bus b, n22 the bus req to the priority decoder 2 and n23 a contact net F1 to "low".

A contact net F1 includes two parallel coupled series coupled pairs of source/drain paths of p-channel MOS FETs p20, p21 and p22, p23, respectively. The net F1 is on one hand connected to earth through the source/drain path of the MOS FET n23 and on the other hand to the voltage source +Vcc. The bus a is connected to the gate of the MOS FET p20 and through an inverter INV 20 to the gate of the MOS FET p23, which thus is fed with the signal a* being the inverted signal a on the bus a. A signal mode.a from the central control unit is fed to the gate of the MOS FET p21 and its inverted signal mode.a* from the central control unit is fed tot he gate of the MOS FET p22. The contact net F1 realizes the function a*mode.a versus a**mode.a*.

A series connection of the source/drain paths of two p-channel MOS FETs p24 and p25 are connected between the voltage source +Vcc and the bus b. The bus a is connected to the gate of the MOS FET p24 and a signal ba from the central control unit is fed to the gate of the MOS FET p25.

The node between the net F1 and the drain of the MOS FET n23 is connected to the gate of a n-channel MOS FET n24 having its source connected to earth and its drain to the bus 4 (MODE) shown in FIGS. 1 and 2 providing the mode-signal. A series connection of the source/drain paths of two p-channel MOS FETs p26 and p27 are connected between the voltage source +Vcc and the bus b. The mode-signal on the bus 4 is also through two inverters INV 21 and INV 22, amplifying the mode-signal, connected to the gate of the MOS FET p27. A signal mode.b is fed from the central control unit to the gate of the MOS FET p26.

The signal mode.a makes the mode operation on the bus a. The signal mode.a* makes also the mode operation on the bus a but forma an inverted value a* on the bus. The signal ba set the bus "high" if the bus a is set "low". The signal mode.b sets bus b to "high" if the bus mode is "low". The signal prech is used to precharge the buses a and b to "low".

Thus, the selection of if the MODE operation is to be made on the signal a or the signal a* is made by aid of the contact net F1. The bus MODE 4 may then be set to earth right through all the closure heads 11 in the object storage. A control signal mode.b on the gate of the transistor p26 will then draw the bus b to a high level. In this way it is possible to make two different tests, on the bus a as well as on the bus b. If the test on the bus a shows a result "high" conditioned in the actual operation, the the bus b may be set "high". For instance, WIRED OR may be made on one of the buses a and b and WIRED AND on the other, and a logical operation may be made in which the condition could be that if the result on the bus a is for instance "false" than the bus b could show "false". Another condition is to make another operation based on the result on the bus b.

A series connection of the source/drain paths of two p-channel MOS FETs p28 and p29 are connected between the voltage source +Vcc and the bus b. The signal grant from the priority decoder 2 is through an inverter INV 23 connected to one input of a NAND gate NAND1 and the signal req to its second input. The NAND gate includes two n-channel MOS FETs 25 and 26 having their source/drain paths series connected and two p-channel MOS FETs p32 and p34 having their source/drain paths parallel connected and connected between the drain of the MOS FET n26 and the source voltage Vcc. The source of the MOS FET n25 is connected to earth. The signal grant* is fed to the gates of the MOS FETs n26 and p34 and the signal req is fed to the gates of the MOS FETs n25 and p32. The output of the NAND gate is connected to the gate of the MOS FET p28 and to the gate of a p-channel MOS FET p33 having its source/drain path connected between the source voltage Vcc and the wire MORE 5. A signal grant.b from the central control unit is fed to the gate of the MOS FET p29.

A series connection of the source/drain paths of two p-channel MOS FETs p30 and p31 are connected between the voltage source +Vcc and the bus req to the priority decoder 2. A signal prio from the central control unit is fed to the gate of the MOS FET p30, and the bus b is connected to the gate of the MOS FET p31.

The signal prio from the central control unit is used to send a request signal to the priority decoder 2, i.e. provide a high signal req, if the bus b is "low". The NAND-gate p32, p34, n25, n26 feels if the signal req is high and the signal grant is low, i.e. if a need for priority is demanded but not chosen. In such a case the NAND-gate goes low and sets the bus 5 (MORE) on "high", i.e. indicating that there is a need for priority. The signal grant.b is used in order to set the bus b "high" if the signal req is "high" and the signal grant is "low". After that first a signal prio has been provided from the central control unit and then a signal grant.b at the most one storage cell in the object storage will have a bus b being "low".

While the invention has been described with reference to specific embodiments, it will be understood by those skilled in the art that various changes may be made and equivalents may be substituted for elements thereof without departing from the true spirit and scope of the invention. In addition, modifications may be made without departing from the essential teaching of the invention.

We claim:

1. An associative memory having a first control bus arrangement (any_type, Vr, cpb, set.s, match, r/w.s, r/w.b, r/w.r, Wand.a, Wand.b, Wor, s.a, reset.b, mode.a mode.a*, prech, ba, mode.b, grant.b, prio etc) for external control, a second memory bus arrangement (t1, t2, id, env, v0, v1, v2, v3) for data comprising:
   several storage cells (1) connected to said memory bus arrangement for storing a composed information, all of said storage cells being simultaneously controllable by said control bus arrangement in accordance with an operation to be performed, means (LAZY, 8) in each of said storage cells for storing at least one mark, said mark(s) indicating at least select state(s) or non select state(s) for said storage cell, means internal to the associative memory for making search operations through the memory bus among said cells to set at least one mark, and means (11) in each storage cell for communicating with said buses and to control said storage cells to take part in an actual logical operation by setting a priority request state for said storage cells when said operation requests selection, said priority request state being based on said mark(s) in said means (8) in each of said storage cells, and a priority decoder (2) to which all said storage cells are coupled which selects one out of several of said storage cells by reading said priority request state from the means (11) setting said priority request state in all storage cells and simultaneously returning an individual signal to each storage cell in the memory indicating said select of non select state(s).

2. A memory according to claim 1, further comprising at least one global bus (4, 5) connected to each said storage cell for making logical operations of a type AND and OR between said storage cells.

3. A memory according to claim 1, wherein each storage cell includes at least one state storage field indicating a state or states of a content in said storage cell.

4. A memory according to claim 1, wherein said storage cells are connected to a combinational central control unit through said control bus arrangement which is distributed to all said storage cells, data words being able to be transferred into or out of said memory on said memory bus arrangement by a composed information provided on said control bus arrangement.

5. A memory according to claim 1, wherein said storage cell includes a number of data object storage fields (IDENTITY, ENVIRONMENT, VALUE/-DES.$_0$, VALUE/DES.$_1$, VALUE/DES.$_2$, VALUE/-DES.$_3$), each data object storage field being able to store a data word and at least one of said marks, being in form of tags.

6. A memory according to claim 5, further comprising at least one second bus (a, b) is provided for said storage fields (6) in each said storage cell in order to make logical operations of the type WIRED AND and WIRED OR between said storage fields, and said priority decoder (2), each of said storage fields being able to read said buses and to take part in an actual logical operation.

7. A memory according to claim 3, wherein each said storage field includes a control element head (8) storing said marks, being in form of tags, and a number of bit cells in which the bits of said data word are stored, each cell being connected to each other and to said head.

8. A memory according to claim 7, wherein said bit cells are controllable from said element head (8) to perform one of the following operations at a time rest in which each said bit cell keeps a stored bit value stored, read in which stored bit values in said bit cells are read, write in which bit values are written in said bit cells, compare in which a data word composed by bit values stored in said bit cells is compared with another data word.

9. A memory according to claim 8, wherein said control from said element head (8) is dependent on logical conditions each being a function of data on said second buses (a, b), earlier mark(s) being in form of tag(s), the result of said comparison in case of said comparison operation and a control signal from said central control unit to said memory.

10. A memory according to claim 8, wherein said mark(s) being in form of tag(s) is settable in dependence on logical conditions each being a function of data on said second buses (a, b), earlier mark(s) being in form of tag(s), the result of said comparison in case of said comparison operation and a control signal from said central control unit to said memory.

11. A memory according to claim 7, wherein a first wire (acc) connected to said element head (8) interconnects all said bit cells within a storage field (6) and wherein all said bit cells are controlled by signals on said wire, and wherein other wires (d, d*) connected to said bit cells are connected to corresponding bit cells in the other storage cells in said memory.

12. A memory according to claim 1, wherein said priority decoder (2) is a combinational circuit and includes one section for each storage cell, each section having a first connection for REQUEST, on which a bit value 'true' represents NEED and a bit value 'false' NO NEED, and a second connection for grant, on which a bit value 'true' represents CHOSEN and 'false' NOT CHOSEN.

13. A memory according to claim 1, wherein a search is made by making a comparison of said mark(s), being in form of tag(s), by control of said element head (8) and to get the result FIT or DIFFERENT, and wherein the search is made in one of the following ways:

(1) searching each storage field (6) individually and independently of the composed information in other storage fields, (2) searching using a comparison to selected storage fields (6) in a storage cell, the result being FIT in every selected storage field, and (3) searching using a comparison to selected storage fields (6) in a storage cell, the result being FIT in at least one of the selected storage fields.

14. A memory according to claim 13, wherein a comparison is made in one of the following ways:

(1) comparing two bit patterns, which comparison results in FIT only when all corresponding bits are alike, and (2) coding the two bit patterns to be compared or only one of them such that at least one of the bits states that the bit pattern information corresponds to an ARBITRARY and a SPECIFIC information value v, if, at a comparison, one of the information values corresponds to ARBITRARY then the result is FIT, otherwise the result is FIT only when the two specific information values v are identical.

15. A memory according to claim 1 including bit cells, all of said bit cells being able to store a bit value, said value being either 'true' or 'false', said cell including:

a first connection (Vcc) which is constantly provided with a supply voltage, a second, a third and a fourth connection (acc, d, d*) each of which is settable in different control states;

said cell circuit being such that each combination of said control states on said second, third and fourth connection is setting said memory bit cell in an individual among a set of functional states.

16. A memory according to claim 15, wherein said control states are high level, low level, no current into cell, current into cell for all said second, third and fourth wires and also current out of cell for at least one of said wires.

17. A memory according to claim 16, wherein said second wire is an access wire (acc) and said third and fourth wires (d, d*) having signals inverted relative to each other when writing or reading said cells.

18. A memory according to claim 17, wherein, between said second wire (acc) and said first wire ($V_{cc}$), a first and a second series connection are provided in parallel, each including the source/drain path of a transistor and a load (T1,L1 and T2, L2), the interconnection between said load and the drain of said transistor in said first series connection being said first node (n1) and being connected to the gate of said transistor in said second series connection and the drain of said transistor in said second series connection being connected to the gate of the transistor in said first series connection, wherein a first rectifying element (D1) is connected between said third wire (d) and said first node permitting current to flow only in one direction relative to said third wire and a second rectifying element (D2) is connected between said fourth wire (d*) and said second node (n2) permitting current to flow only in one direction relative to said fourth wire.

19. A memory according to claim 18, wherein said rectifying elements (D1 and D2) are chosen among the following components:
   (1) n-channel MOS FET in which the drain and the gate are interconnected (positive voltages),
   (2) p-channel MOS FET in which the drain and the gate are interconnected (negative voltages),
   (3) pn-diode (positive voltages, negative voltages with the diode reversed),
   (4) Schottky-diode (positive voltages, negative voltages with the diode reversed.

20. A memory according to claim 18, wherein said transistor (T1 and T2) are chosen among the following components:
   (1) n-channel MOS FET (positive voltages),
   (2) p-channel MOS FET (negative voltages),
   (3) npn bipolar transistor (positive voltages),
   (4) pnp bipolar transistor (negative voltages).

21. A memory according to claim 18, wherein said loads (L1 and L2) are chosen among the following components:
   (1) a resistor,
   (2) n-channel enhancement type MOS FET having its drain and gate interconnected (positive voltages),
   (3) p-channel enhancement type MOS FET having its drain and gate interconnected (negative voltages),
   (4) n-channel depletion type MOS FET having its source and gate interconnected (positive voltages),
   (5) p-channel depletion type MOS FET having its source and gate interconnected (negative voltages),
   (6) n-channel MOS FET having its gate as a control electrode and the source and the drain as drive connections (positive voltages),
   (7) p-channel MOS FET having its gate as a control electrode and the source and the drain as drive connections (negative voltages),
   (8) pnp bipolar transistor having the base as the control electrode and the emitter and collector as drive connections (positive voltages),
   (9) npn bipolar transistor having the base as the control electrode and the emitter and collector as drive connections (negative voltages).

22. A memory according to claim 15, in which a bit value is storable, said value being either 'true' or 'false', wherein the following functional states are settable by said control states:
   rest in which said cell is just storing said bit value,
   read in which said bit value can be read,
   don't read in which said cell is just storing said bit value,
   write false in which said stored bit value is set to 'false',
   write true in which said stored bit value is set to 'true',
   don't write in which said cell is just storing said bit value,
   comp. false in which said stored bit value is compared to a value 'false',
   comp. true in which said stored bit value is compared to a value 'true',
   don't comp. in which said cell is just storing said bit value.

23. A memory according to claim 15, wherein said bit cells contain a flip-flop controlable from each side via said third and fourth wires (d, d*), wherein said flip-flop has a first and a second node settable on essentially a first and a second voltage level, and wherein said flip-flop has its supply voltage between said first (Vcc) and second wires (acc), said second wire being controllable to different voltage levels.

* * * * *